(12) United States Patent
Gui et al.

(10) Patent No.: US 11,670,702 B2
(45) Date of Patent: Jun. 6, 2023

(54) THIN FILM TRANSISTOR AND MANUFACTURING METHOD THEREOF, ARRAY SUBSTRATE, DISPLAY DEVICE AND SENSOR

(71) Applicants:Beijing BOE Display Technology Co., Ltd., Beijing (CN); BOE Technology Group Co., Ltd., Beijing (CN)

(72) Inventors: Bingqiang Gui, Beijing (CN); Lianjie Qu, Beijing (CN); Yonglian Qi, Beijing (CN); Hebin Zhao, Beijing (CN); Yun Qiu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/650,484

(22) PCT Filed: Sep. 11, 2019

(86) PCT No.: PCT/CN2019/105284
§ 371 (c)(1),
(2) Date: Mar. 25, 2020

(87) PCT Pub. No.: WO2020/063342
PCT Pub. Date: Apr. 2, 2020

(65) Prior Publication Data
US 2021/0210622 A1   Jul. 8, 2021

(30) Foreign Application Priority Data

Sep. 25, 2018   (CN) .......................... 201811119902.1

(51) Int. Cl.
*H01L 21/00* (2006.01)
*H01L 29/66* (2006.01)
(Continued)

(52) U.S. Cl.
CPC .. *H01L 29/66772* (2013.01); *H01L 21/02488* (2013.01); *H01L 21/02494* (2013.01);
(Continued)

(58) Field of Classification Search
CPC ......... H01L 29/66772; H01L 21/02488; H01L 21/02494; H01L 21/02598;
(Continued)

(56) References Cited

U.S. PATENT DOCUMENTS

2001/0005019 A1* 6/2001 Ishikawa ............ G02F 1/136213
257/E27.111
2005/0239659 A1* 10/2005 Xiong .................... C23C 14/225
505/300
(Continued)

FOREIGN PATENT DOCUMENTS

CN           1929101 A       3/2007
CN        101093800 A      12/2007
(Continued)

OTHER PUBLICATIONS

International search report of PCT application No. PCT/CN2019/105284 dated Dec. 9, 2019.
(Continued)

*Primary Examiner* — Richard A Booth
(74) *Attorney, Agent, or Firm* — Lippes Mathias LLP

(57) ABSTRACT

Provided is a thin film transistor including a highly-textured dielectric layer, an active layer, a gate electrode and a source/drain electrode that are stacked on a base substrate. The source/drain electrode includes a source electrode and a drain electrode. The gate electrode and the active layer are insulated from each other. The source electrode and the drain electrode are electrically connected to the active layer. Constituent particles of the active layer are of monocrystalline silicon-like structures. According to the present disclo-
(Continued)

sure, the highly-textured dielectric layer is adopted to replace an original buffer layer to induce the active layer to grow into a monocrystalline silicon-like structure, such that the performance of the thin film transistor is improved.

17 Claims, 5 Drawing Sheets

(51) Int. Cl.
*H01L 21/02* (2006.01)
*H01L 29/786* (2006.01)
*H01L 27/12* (2006.01)

(52) U.S. Cl.
CPC .. *H01L 21/02598* (2013.01); *H01L 29/78603* (2013.01); *H01L 29/78654* (2013.01); *H01L 21/02175* (2013.01); *H01L 21/02189* (2013.01); *H01L 21/02266* (2013.01); *H01L 21/02491* (2013.01); *H01L 21/02505* (2013.01); *H01L 21/02516* (2013.01); *H01L 21/02532* (2013.01); *H01L 21/02609* (2013.01); *H01L 21/02686* (2013.01); *H01L 27/1214* (2013.01)

(58) Field of Classification Search
CPC ......... H01L 29/78603; H01L 29/78654; H01L 21/02175; H01L 21/02189; H01L 21/02266; H01L 21/02516; H01L 21/02532; H01L 21/02609; H01L 21/02686; H01L 27/1214

See application file for complete search history.

(56) References Cited

U.S. PATENT DOCUMENTS

| | | | |
|---|---|---|---|
| 2007/0298595 A1* | 12/2007 | Kakkad | H01L 21/02488 257/E21.413 |
| 2013/0001689 A1 | 1/2013 | Sambandan et al. | |
| 2019/0280018 A1 | 9/2019 | Song et al. | |

FOREIGN PATENT DOCUMENTS

| | | |
|---|---|---|
| CN | 106876327 A | 6/2017 |
| CN | 109801973 A | 5/2019 |

OTHER PUBLICATIONS

First office action of Chinese application No. 201811119902.1 dated Dec. 31, 2019.

* cited by examiner

THIN FILM TRANSISTOR AND MANUFACTURING METHOD THEREOF, ARRAY SUBSTRATE, DISPLAY DEVICE AND SENSOR

This application is a 371 of PCT/CN2019/105284, filed Sep. 11, 2019, which claims priority to Chinese patent application No. 201811119902.1, filed Sep. 25, 2018 and entitled "THIN FILM TRANSISTOR AND MANUFACTURING METHOD THEREOF, ARRAY SUBSTRATE, AND DISPLAY DEVICE", all the above applications are incorporated herein by reference in their entireties.

TECHNICAL FIELD

The present disclosure relates to the field of display technologies, and in particular to a thin film transistor and a manufacturing method thereof, an array substrate, a display device and a sensor.

BACKGROUND

A display panel usually includes multiple pixel units, each of which is provided with a thin film transistor (TFT). The TFT is a basic circuit element that controls display brightness of the pixel unit, and may include a buffer layer, an active layer, a gate insulating layer, a gate electrode, a source/drain electrode, etc., that are stacked on a base substrate. The source/drain electrode includes a source electrode and a drain electrode. The active layer provides an electric channel for the source electrode and the drain electrode. The buffer layer is usually made from silicon nitride ($SiN_x$) or silicon oxide ($SiO_2$). In a conventional amorphous silicon (A-Si) TFT, the active layer is an A-Si layer.

With the rapid development of display technologies, the requirement on the performance of a display product is getting higher and higher. The conventional A-Si TFT cannot satisfy the requirement of the display product, so an oxide TFT and a low-temperature poly-silicon (LTPS) TFT are provided in related art. In the oxide TFT, the active layer may be made from a metal oxide material such as an indium gallium zinc oxide (IGZO). In the LTPS TFT, the active layer is a polycrystalline silicon (P—Si) layer obtained by crystallizing A-Si.

SUMMARY

Embodiments of the present disclosure provide a thin film transistor and a manufacturing method thereof, an array substrate, a display device and a sensor. The technical solutions are as follows.

In an aspect, a thin film transistor is provided. The thin film transistor includes a highly-textured dielectric layer, an active layer, a gate electrode and a source/drain electrode that are disposed on a base substrate;

wherein the active layer is disposed on aside, away from the base substrate, of the highly-textured dielectric layer; the gate electrode and the active layer are insulated from each other, and the source/drain electrode includes a source electrode and a drain electrode that are electrically connected to the active layer; and the active layer is a semiconductor film layer including a material of a monocrystalline silicon-like structure.

Optionally, constituent particles of the highly-textured dielectric layer have the same orientation index as monocrystalline silicon.

Optionally, the highly-textured dielectric layer is made from any one of magnesium oxide, cerium oxide and zirconium oxide doped with yttrium.

Optionally, the gate electrode is disposed on aside, away from the base substrate, of the active layer, and the source/drain electrode is disposed on a side, away from the base substrate, of the gate electrode.

Optionally, the thin film transistor further includes a first gate insulating layer and a second gate insulating layer;

wherein the first gate insulating layer is disposed between the active layer and the gate electrode, and the second gate insulating layer is disposed between the gate electrode and the source/drain electrode.

Optionally, the gate electrode is disposed on a side, close to the base substrate, of the highly-textured dielectric layer, and the source/drain electrode is disposed on a side, away from the base substrate, of the active layer.

Optionally, the thin film transistor further includes a first gate insulating layer disposed between the highly-textured dielectric layer and the gate electrode.

In another aspect, a method of manufacturing a thin film transistor is provided. The method includes:

providing a base substrate;

forming a highly-textured dielectric layer on the base substrate;

forming an amorphous silicon layer on the base substrate on which the highly-textured dielectric layer is formed;

crystallizing the amorphous silicon layer to convert the amorphous silicon layer into a semiconductor film layer made from a material of a monocrystalline silicon-like structure, to form an active layer; and forming a gate electrode and a source/drain electrode on the base substrate, wherein the source/drain electrode includes a source electrode and a drain electrode, the gate electrode and the active layer are insulated from each other, and the source electrode and the drain electrode are electrically connected to the active layer.

Optionally, prior to crystallizing the amorphous silicon layer, the method further includes:

dehydrogenating the amorphous silicon layer.

Optionally, forming the amorphous silicon layer on the base substrate on which the highly-textured dielectric layer is formed includes:

depositing an amorphous silicon material on a side, away from the base substrate, of the highly-textured dielectric layer to form the amorphous silicon layer.

Optionally, crystallizing the amorphous silicon layer includes:

crystallizing the amorphous silicon layer by an excimer laser annealing process.

Optionally, forming the highly-textured dielectric layer on the base substrate includes:

forming the highly-textured dielectric layer on the base substrate by an electron beam evaporation process or an ion beam deposition process.

Optionally, forming the gate electrode and the source/drain electrode on the base substrate includes:

sequentially forming the gate electrode and the source/drain electrode on the base substrate on which the active layer is formed.

Optionally, after forming the active layer and prior to forming the gate electrode on the base substrate on which the active layer is formed, the method further includes: forming a first gate insulating layer on the base substrate on which the active layer is formed; and after forming the gate electrode and prior to forming the source/drain electrode, the method further includes:

forming a second gate insulating layer on the base substrate on which the gate electrode is formed.

Optionally, forming the gate electrode and the source/drain electrode on the base substrate on which the active layer is formed includes:

prior to forming the highly-textured dielectric layer, forming the gate electrode on the base substrate; and after forming the active layer, forming the source/drain electrode on the base substrate on which the active layer is formed.

Optionally, constituent particles of the highly-textured dielectric layer have the same orientation index as monocrystalline silicon.

Optionally, the highly-textured dielectric layer is made from any one of magnesium oxide, cerium oxide and zirconium oxide doped with yttrium.

In yet another aspect, an array substrate is provided. The array substrate includes a base substrate and the thin film transistor disposed on the base substrate in the above-described aspect.

In still yet another aspect, a display device is provided. The display device includes the array substrate in the above-described aspect. The display device is a liquid crystal display, an organic light-emitting diode display or a quantum-dot light-emitting diode display.

In still yet another aspect, a sensor is provided. The sensor includes the array substrate the above-described aspect. The sensor is a photoelectric sensor, a pressure sensor or a fingerprint sensor.

DETAILED DESCRIPTION

Embodiments of the present disclosure will be described in further detail with reference to the accompanying drawings, to present the objects, technical solutions, and advantages of the present disclosure more clearly.

In an LTPS TFT in the related art, the leakage current is high due to the grain boundary defect of P—Si in an active layer, and thus the performance of the TFT is adversely affected. Therefore, the LTPS TFT in the related art has relatively poor performance.

Figure 1:
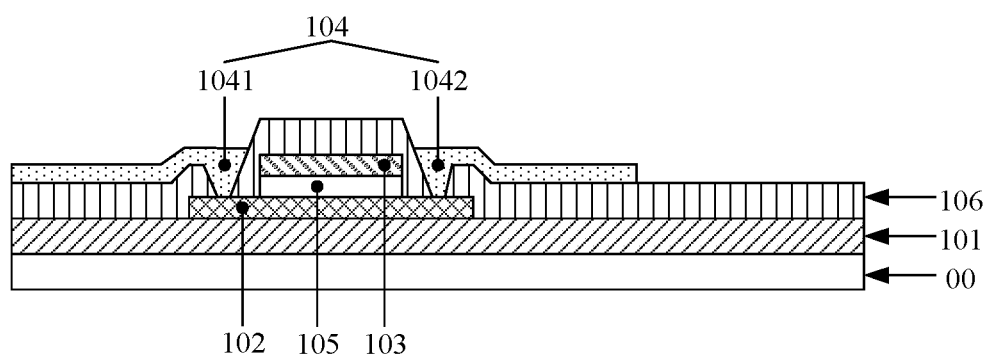
FIG. 1 is a schematic structural diagram of a TFT in accordance with an embodiment of the present disclosure.

FIG. 1 is a schematic structural diagram of a TFT in accordance with an embodiment of the present disclosure. As illustrated in FIG. 1, the TFT 10 includes: a highly-textured dielectric layer 101, an active layer 102, a gate electrode 103 and a source/drain electrode 104 that are disposed on a base substrate 00. The active layer 102 is disposed on the side, away from the base substrate 00, of the highly-textured dielectric layer 101. That is, the active layer 102 is formed on the highly-textured dielectric layer 101. The gate electrode 103 and the active layer 102 are insulated from each other. The source/drain electrode 104 includes a source electrode 1041 and a drain electrode 1042 that are electrically connected to the active layer 102.

The active layer is a semiconductor film layer including a material of a monocrystalline silicon-like structure. For example, the active layer may be a semiconductor film layer made from a material of a monocrystalline silicon-like structure. In the semiconductor film layer including the material of the monocrystalline silicon-like structure, grains are high in orientation consistency and size uniformity. That is, the semiconductor film layer including the material of the monocrystalline silicon-like structure is a highly-textured monocrystalline silicon-like structure is a highly-textured semiconductor film layer.

It should be noted that the term "highly textured" means that orientation indexes in crystals are high in consistency, and the orientation index may also be referred to as lattice orientation.

In summary, according to the TFT provided by the embodiment of the present disclosure, by forming the active layer on the base substrate on which the highly-textured dielectric layer is formed, owing to the relatively high consistency of the orientation indexes of constituent particles of the highly-textured dielectric layer, the active layer can be induced to grow into a monocrystalline silicon-like structure. In addition, since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. Moreover, the monocrystalline silicon-like structure has higher carrier mobility than P—Si. Thus, the performance of the TFT is improved.

As an optional implementation, the TFT 10 may be a top-gate TFT. Correspondingly, referring to FIG. 1, the gate electrode 103 may be disposed on the side, away from the base substrate 00, of the active layer 102, and the source/drain electrode 104 may be disposed on the side, away from the base substrate 00, of the gate electrode 103.

Continuously referring to FIG. 1, the TFT 10 may further include a first gate insulating layer 105 and a second gate insulating layer 106. The first gate insulating layer 105 is disposed between the active layer 102 and the gate electrode 103, and the second gate insulating layer 106 is disposed between the gate electrode 103 and the source/drain electrode 104. The source electrode 1041 and the drain electrode 1042 are connected to the active layer 102 by vias formed in the second gate insulating layer 106.

As another optional implementation, the TFT 10 may be a bottom-gate TFT. Correspondingly, referring to FIG. 2, the gate electrode 103 may be disposed on the side, close to the base substrate 00, of the highly-textured dielectric layer 101, and the source/drain electrode 104 may be disposed on the side, away from the base substrate 00, of the active layer 102.

Figure 2:
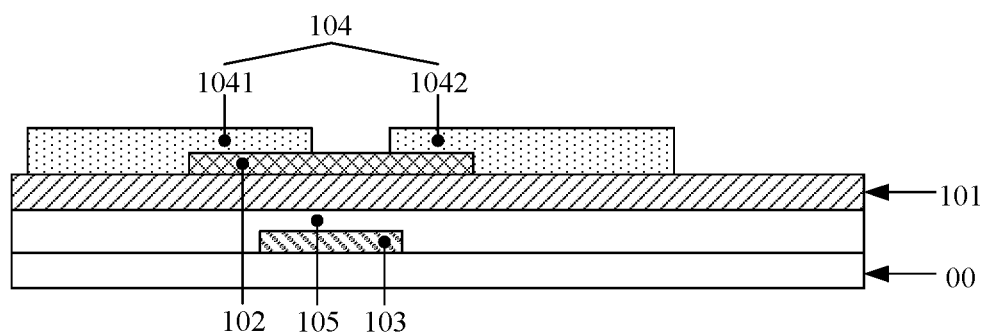
FIG. 2 is a schematic structural diagram of another TFT in accordance with an embodiment of the present disclosure.

Continuously referring to FIG. 2, the TFT 10 may further include a first gate insulating layer 105 disposed between the gate electrode 103 and the highly-textured dielectric layer 101.

Optionally, constituent particles of the highly-textured dielectric layer have the same orientation index as monocrystalline silicon. For example, the orientation index of monocrystalline silicon may be (111), and then particles with the orientation index (111) may be adopted to form the highly-textured dielectric layer on the base substrate. For another example, the orientation index of monocrystalline silicon may be (100), and particles with the orientation index (100) may also be adopted to form the highly-textured dielectric layer on the base substrate. In the embodiment of the present disclosure, the highly-textured dielectric layer may substantially function as a buffer layer and an induction template layer, and the induction template layer is configured to induce the constituent particles of the active layer to be crystallized with a specified orientation index during growth.

Optionally, the highly-textured dielectric layer is made from any one of MgO, $CeO_2$ and YS—$ZrO_2$, and it may also be made from other materials, which is not limited in the embodiment of the present disclosure.

In summary, according to the TFT provided by the embodiment of the present disclosure, by forming the active layer on the base substrate on which the highly-textured dielectric layer is formed, owing to the relatively high consistency of the orientation indexes of constituent particles of the highly-textured dielectric layer, the active layer can be induced to grow into a monocrystalline silicon-like structure. In addition, since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. Moreover, the monocrystalline silicon-like structure has higher carrier mobility than P—Si. Thus, the performance of the TFT is improved.

Figure 3:
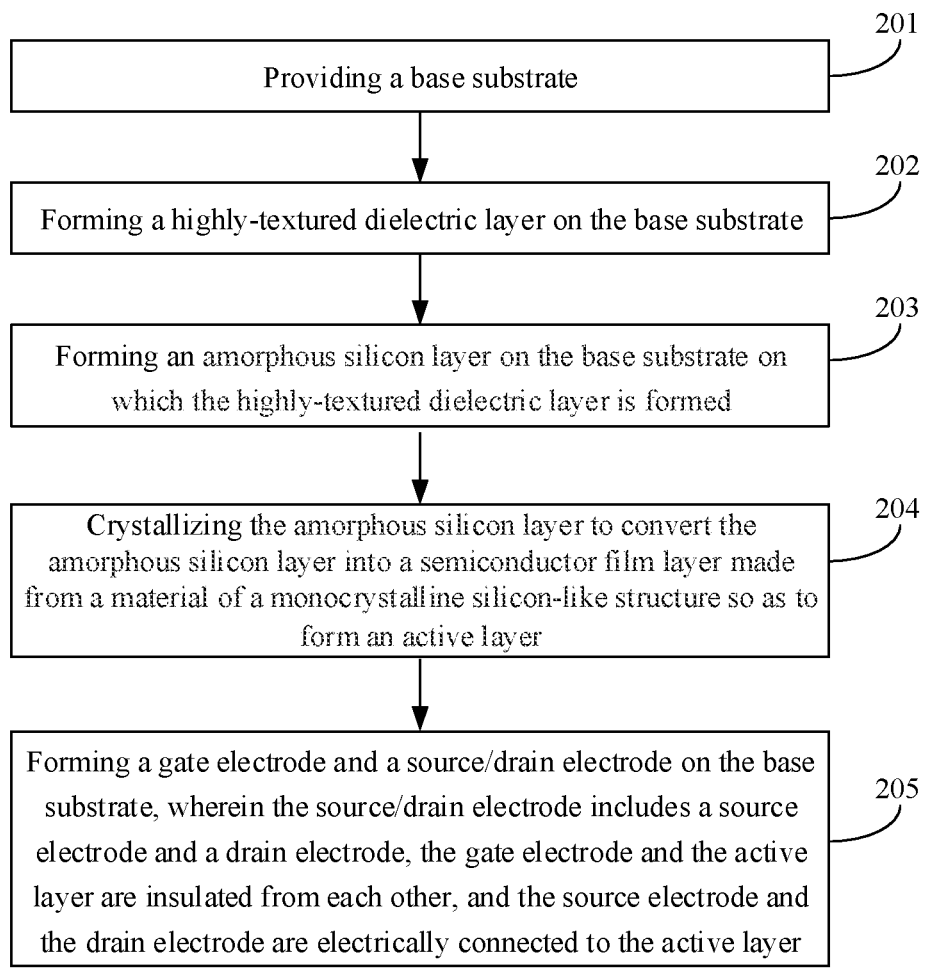
FIG. 3 is a flow chart of a method of manufacturing a TFT in accordance with an embodiment of the present disclosure.

FIG. 3 is a flow chart of a manufacturing method of a TFT in accordance with an embodiment of the present disclosure. The manufacturing method may be used to manufacture the TFT provided in the foregoing embodiments. As illustrated in FIG. 3, the method includes the following steps.

In step 201, a base substrate is provided.

In step 202, a highly-textured dielectric layer is formed on the base substrate.

In step 203, an amorphous silicon layer is formed on the base substrate on which the highly-textured dielectric layer is formed.

In step 204, the amorphous silicon layer is crystallized to convert the amorphous silicon layer into a semiconductor film layer made from a material of a monocrystalline silicon-like structure so as to form an active layer.

In step 205, a gate electrode and a source/drain electrode are formed on the base substrate, wherein the source/drain electrode includes a source electrode and a drain electrode, the gate electrode and the active layer are insulated from each other, and the source electrode and the drain electrode are electrically connected to the active layer.

It should be noted that the order of the steps of the above-mentioned manufacturing method of the TFT may be appropriately adjusted, and the steps may also be added or removed according to the situation. For example, step 205 may be performed after step 204, or the sub-step of forming the gate electrode in step 205 may be performed before step 204, and for example, may be performed between step 201 and step 202.

In summary, according to the manufacturing method of the TFT provided by the embodiment of the present disclosure, by forming the A-Si layer on the base substrate on which the highly-textured dielectric layer is formed, owing to the relatively high consistency of the orientation indexes of constituent particles of the highly-textured dielectric layer, the highly-textured dielectric layer can induce constituent particles of the A-Si layer to be crystallized in the same direction as the orientation indexes of the constituent particles of the highly-textured dielectric layer during crystallization of the A-Si layer. That is, the constituent particles of the A-Si layer are induced to be converted from an A-Si structure into a monocrystalline silicon-like structure so as to form the active layer. Since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. In addition, the monocrystalline silicon-like structure has higher carrier mobility than P—Si. Thus, the performance of the TFT is improved.

Figure 4:
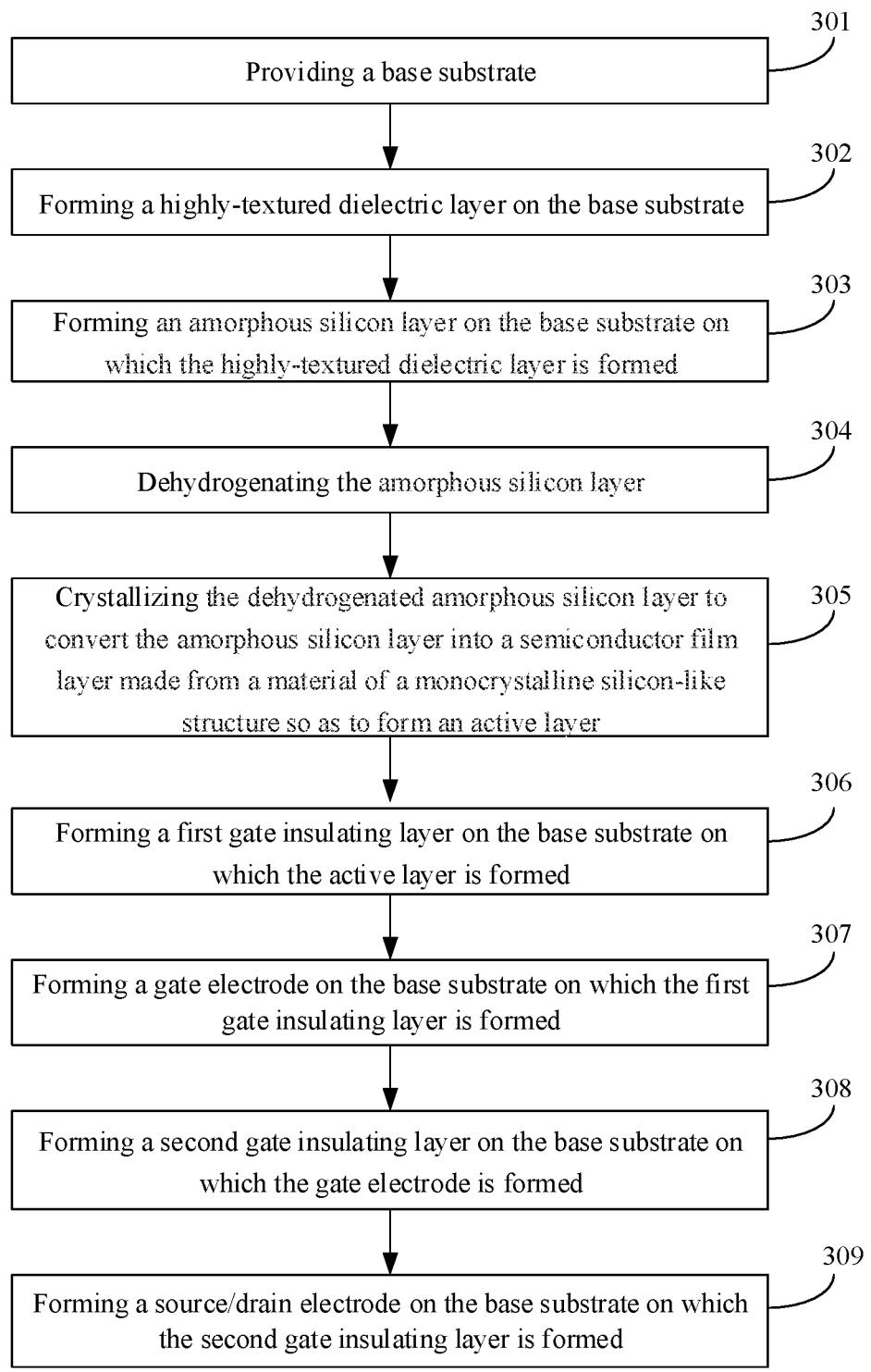
FIG. 4 is a flow chart of another method of manufacturing a TFT in accordance with an embodiment of the present disclosure.

FIG. 4 is a flow chart of another manufacturing method of a TFT in accordance with an embodiment of the present disclosure. The manufacturing method can be used to manufacture the TFT of the top-gate structure illustrated in FIG. 1. As illustrated in FIG. 4, the method includes the following steps.

In step 301, a base substrate is provided.

Optionally, the base substrate may be made of a material, such as glass, a silicon wafer, quartz or plastic, which is not limited in the embodiment of the present disclosure.

In step 302, a highly-textured dielectric layer is formed on the base substrate.

Figure 5:
FIG. 5 is a schematic diagram illustrating formation of a highly-textured dielectric layer in accordance with an embodiment of the present disclosure.

Optionally, as illustrated in FIG. 5, the highly-textured dielectric layer 101 may be formed by depositing a highly-textured dielectric material on the base substrate 00. For example, the highly-textured dielectric layer is formed on the base substrate by an electron beam evaporation process or an ion beam deposition process. Alternatively, the highly-textured dielectric layer may also be formed on the base substrate by means of magnetron sputtering or plasma enhanced chemical vapor deposition (PECVD). The preparation process of the highly-textured dielectric layer is not limited in the embodiment of the present disclosure.

Optionally, constituent particles of the highly-textured dielectric layer have the same orientation index as monocrystalline silicon. For example, the orientation index of monocrystalline silicon may be (111), and then particles with the orientation index of (111) may be adopted to form the highly-textured dielectric layer on the base substrate. For another example, the orientation index of monocrystalline silicon may be (100), and particles with the orientation index of (100) may also be adopted to form the highly-textured dielectric layer on the base substrate.

In the embodiment of the present disclosure, the highly-textured dielectric layer may substantially function as a buffer layer and an induction template layer, and the induction template layer is configured to induce the constituent particles of the active layer to be crystallized with a specified orientation index during growth.

Optionally, the highly-textured dielectric layer is made from any one of MgO, $CeO_2$ and YS—$ZrO_2$, and it may also be made from other materials, which is not limited in the embodiment of the present disclosure.

In step 303, an amorphous silicon layer is formed on the base substrate on which the highly-textured dielectric layer is formed.

Figure 6:
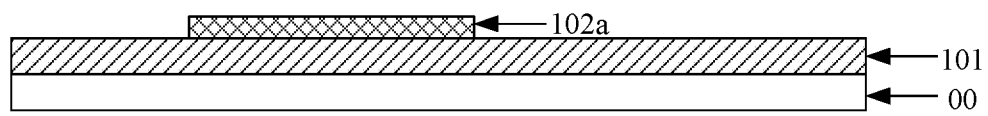
FIG. 6 is a schematic diagram illustrating formation of an A-Si layer in accordance with an embodiment of the present disclosure.

Optionally, as illustrated in FIG. 6, an amorphous silicon material may be deposited on the side, away from the base substrate 00, of the highly-textured dielectric layer 101 to form the amorphous silicon layer 102a.

In step 304, the amorphous silicon layer is dehydrogenated.

Figure 7:
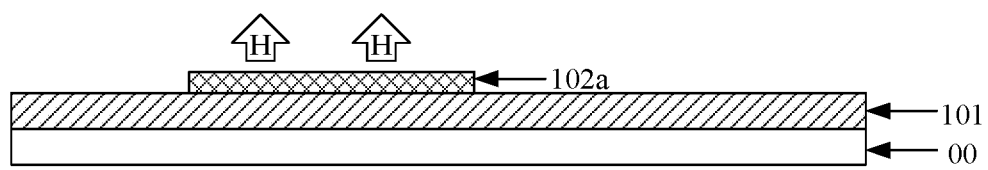
FIG. 7 is a schematic diagram illustrating dehydrogenation of an A-Si layer in accordance with an embodiment of the present disclosure.

It should be noted that referring to FIG. 7, the amorphous silicon layer 102a may be dehydrogenated before being crystallized to be prevented from hydrogen explosion during crystallization. Thus, components are protected against damages.

In step 305, the dehydrogenated amorphous silicon layer is crystallized to convert the amorphous silicon layer into a semiconductor film layer made from a material of a monocrystalline silicon-like structure so as to form an active layer.

Figure 8:
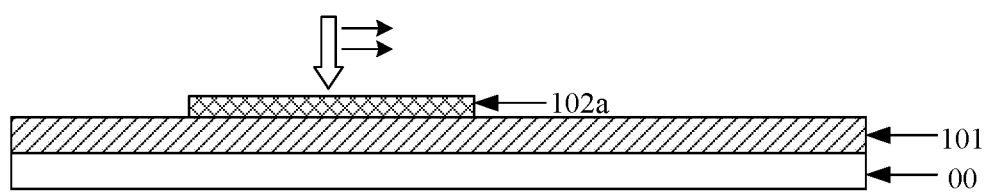
FIG. 8 is a schematic diagram illustrating crystallization of an A-Si layer in accordance with an embodiment of the present disclosure.

Optionally, referring to FIG. 8, the amorphous silicon layer 102a may be crystallized by an excimer laser annealing (ELA) process. The adopted crystallization process is not limited in the embodiment of the present disclosure.

It should be noted that owing to the relatively high consistency of the orientation indexes of constituent particles of the highly-textured dielectric layer, the highly-textured dielectric layer can induce constituent particles of the A-Si layer to be crystallized in the same direction as the orientation indexes of the constituent particles of the highly-textured dielectric layer during crystallization of the A-Si layer. That is, the constituent particles of the A-Si layer are induced to be converted from an A-Si structure into a monocrystalline silicon-like structure so as to form the active layer.

In step 306, a first gate insulating layer is formed on the base substrate on which the active layer is formed.

Optionally, an insulating material with a certain thickness may be deposited on the base substrate, on which the active layer is formed, by means of magnetron sputtering, thermal evaporation, PECVD or the like to obtain a first insulating material layer. Then, the first insulating material layer is processed by a patterning process to obtain the first gate insulating layer. The insulating material may be $SiN_x$, $SiO_2$, an organic insulating material or the like. The thickness of the first gate insulating layer may be determined according to actual needs.

In step 307, agate electrode is formed on the base substrate on which the first gate insulating layer is formed.

Optionally, a gate metal material with a certain thickness may be deposited on the base substrate, on which the first gate insulating layer is formed, by means of magnetron sputtering, thermal evaporation, PECVD or the like to obtain a gate metal material layer. Then, the gate metal material layer is processed by a patterning process to obtain the gate electrode. The gate metal material may be Mo, Cu, Al, or an alloy material thereof. The thickness of the gate electrode may be determined according to actual needs.

It should be noted that the first gate insulating layer is configured to insulate and isolate the active layer from the gate electrode. In addition, to effectively insulate the active layer from the gate electrode, an orthographic projection of the first gate insulating layer on the base substrate may cover an orthographic projection of the gate electrode on the base substrate.

For example, the orthographic projection of the first gate insulating layer on the base substrate and the orthographic projection of the gate electrode on the base substrate may coincide. In this case, the first gate insulating layer and the gate electrode may be formed by a one-time patterning process. The formation process may include the following steps: sequentially forming a first insulating material layer and a gate metal material layer on the base substrate on which the active layer is formed; and processing the first insulating material layer and the gate metal material layer by the one-time patterning process to obtain the first gate insulating layer and the gate electrode.

Compared with implementation of respectively forming the first gate insulating layer and the gate electrode by a patterning processes, at least one pattering process can be removed by forming the first gate insulating layer and the gate electrode by the one-time patterning process such that manufacture of the TFT is simplified and the manufacturing cost of the TFT is lowered.

In step 308, a second gate insulating layer is formed on the base substrate on which the gate electrode is formed.

Optionally, a second insulating material with a certain thickness may be deposited on the base substrate, on which the gate electrode is formed, by means of magnetron sputtering, thermal evaporation, PECVD or the like to obtain a second insulating material layer. Then, the second insulating material layer is processed by a patterning process to obtain the second gate insulating layer. Moreover, a plurality of vias are formed in the second gate insulating layer to guarantee an effective contact between the active layer and the source electrode, as well as an effective contact between the active layer and the drain electrode.

The second insulating material may be $SiN_x$, $SiO_2$, an organic insulating material or the like. The second insulating material may be the same as or different from the first insulating material, which is not limited in the embodiment of the present disclosure.

In step 309, a source/drain electrode is formed on the base substrate on which the second gate insulating layer is formed.

Optionally, a source/drain metal material with a certain thickness may be deposited on the base substrate, on which the second gate insulating layer is formed, by means of magnetron sputtering, thermal evaporation, PECVD or the like to obtain a source/drain metal thin film layer. Then, the source/drain metal thin film layer is processed by a patterning process to obtain the source/drain electrode.

The source/drain electrode includes a source electrode and a drain electrode. The source electrode and the drain electrode may be connected to the active layer by the vias in the second gate insulating layer. The source/drain metal material may be Mo, Cu, Al, or an alloy material thereof. The thickness of the source/drain electrode may be determined according to actual needs.

In the embodiment of the present disclosure, in order to ensure an effective contact between the source/drain electrode and the active layer, there may be a non-overlapping area between the orthographic projection of the active layer on the base substrate and the orthographic projection of the gate electrode on the base substrate, and there may also be a non-overlapping area between the orthographic projection of the active layer on the base substrate and the orthographic projection of the first gate insulating layer on the base substrate, such that the vias may be conveniently formed in the second gate insulating layer above the non-overlapping areas. Thus, the source electrode and the drain electrode may be connected to the active layer by vias, respectively.

Figure 9:
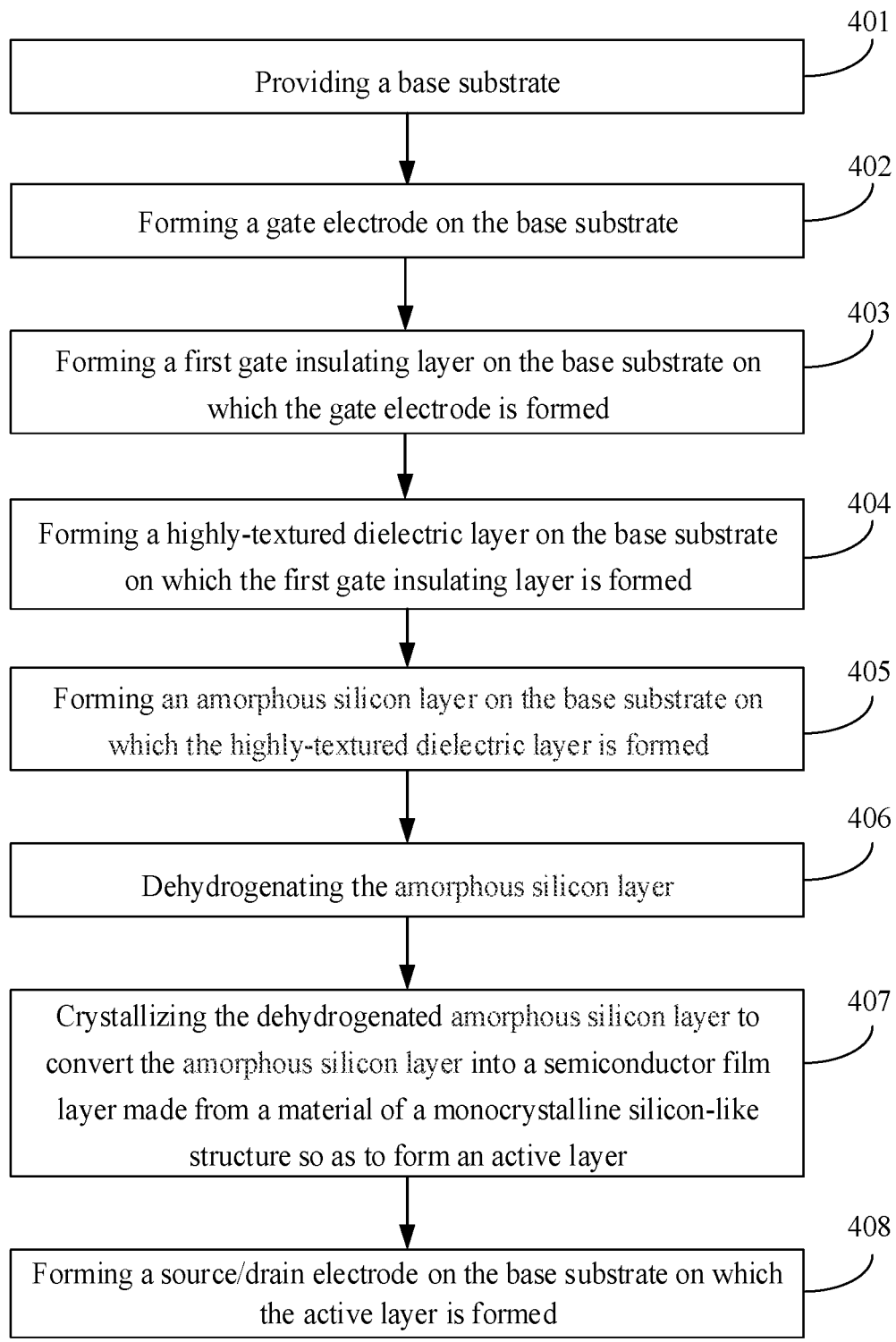
FIG. 9 is a flow chart of yet another method of manufacturing a TFT in accordance with an embodiment of the present disclosure.

FIG. 9 is a flow chart of yet another manufacturing method of a TFT in accordance with an embodiment of the present disclosure. The manufacturing method may be used to manufacture the TFT of the bottom-gate structure illustrated in FIG. 2. As illustrated in FIG. 9, the method includes the following steps.

In step 401, a base substrate is provided.

In step 402, a gate electrode is formed on the base substrate.

In step 403, a first gate insulating layer is formed on the base substrate on which the gate electrode is formed.

In step 404, a highly-textured dielectric layer is formed on the base substrate on which the first gate insulating layer is formed.

In step 405, an amorphous silicon layer is formed on the base substrate on which the highly-textured dielectric layer is formed.

In step 406, the amorphous silicon layer is dehydrogenated.

In step 407, the dehydrogenated amorphous silicon layer is crystallized to convert the amorphous silicon layer into a semiconductor film layer made from a material of a monocrystalline silicon-like structure so as to form an active layer.

In step 408, a source/drain electrode is formed on the base substrate on which the active layer is formed.

Reference may be made to relevant descriptions in steps 301 to 309 for implementation of steps 401 to 408, which is not be repeated herein.

It should be noted that the order of the steps of the above-mentioned manufacturing method of the TFT may be appropriately adjusted, and the steps may also be added or removed according to the situation. Within the technical scope disclosed by the present disclosure, any variations of the methods easily derived by those skilled in the art shall fall within the protection scope of the present disclosure, and thus, will not be repeated herein.

In summary, according to the manufacturing method of the TFT provided by the embodiment of the present disclosure, by forming the A-Si layer on the base substrate on which the highly-textured dielectric layer is formed, owing to the relatively high consistency of the orientation indexes of constituent particles of the highly-textured dielectric layer, the highly-textured dielectric layer can induce constituent particles of the A-Si layer to be crystallized in the same direction as the orientation indexes of the constituent particles of the highly-textured dielectric layer during crystallization of the A-Si layer. That is, the constituent particles of the A-Si layer are induced to be converted from an A-Si structure into a monocrystalline silicon-like structure so as to form the active layer. Since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. In addition, the monocrystalline silicon-like structure has higher carrier mobility than P—Si. Thus, the performance of the TFT is improved. Further, according to the manufacturing method of the TFT provided by the embodiment of the present disclosure, reference may be made to the LTPS TFT for the equipment and process parameters used during preparation of the TFT. Thus, the processes and equipment used in the present disclosure have a high compatibility with the conventional processes and equipment. Hence, the production feasibility is improved.

An embodiment of the present disclosure provides an array substrate. Referring to FIGS. 1 and 2, the array substrate may include a base substrate 00 and a TFT disposed on the base substrate 00, and the TFT is as provided in the foregoing embodiments.

Optionally, the array substrate provided in the present embodiment may be applied to a liquid crystal display (LCD), an organic light-emitting diode (OLED) display, a quantum-dot light-emitting diode (QLED) display or a sensor.

Exemplarily, the array substrate applied to an LCD may include a base substrate, as well as a TFT, a planarization layer, an electrode layer (a common electrode layer or a pixel electrode layer) and an alignment layer that are disposed on the base substrate. The array substrate applied to an OLED display or a QLED display may include a base substrate, as well as a TFT, a first electrode, a pixel defining layer, a light-emitting layer, and a second electrode that are disposed on the base substrate. The first electrode and the second electrode are one of an anode and a cathode, respectively.

In summary, according to the array substrate provided by the embodiment of the present disclosure, in the TFT of the array substrate, by forming the active layer on the base substrate on which the highly-textured dielectric layer is formed, owing to the relatively high consistency of the orientation indexes of constituent particles of the highly-textured dielectric layer, the active layer can be induced to grow into a monocrystalline silicon-like structure. In addition, since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. In addition, the monocrystalline silicon-like structure has higher carrier mobility than P—Si. Thus, the performance of the array substrate is improved.

An embodiment of the present disclosure provides a display device including the above-mentioned array substrate.

Optionally, the display device may be an LCD, an OLED display, a QLED display or the like. For example, the display device may be a product or component having a display function, such as electronic paper, a mobile phone, a tablet computer, a television, a display, a notebook computer, a digital photo frame, or a navigator.

In summary, according to the display device provided by the embodiment of the present disclosure, in the TFT of the display device, by forming the active layer on the base substrate on which the highly-textured dielectric layer is formed, owing to the relatively high consistency of the orientation indexes of constituent particles of the highly-textured dielectric layer, the active layer can be induced to grow into a monocrystalline silicon-like structure. In addition, since the monocrystalline silicon-like structure has fewer grain boundary defects than P—Si, compared with the LTPS TFT in the related art, the TFT provided by the embodiment of the present disclosure can alleviate the problem of high leakage current caused by the grain boundary defects. In addition, the monocrystalline silicon-like structure has higher carrier mobility than P—Si. Thus, the performance of the display device is improved.

An embodiment of the present disclosure further provides a sensor that may include the above-mentioned array substrate. Exemplarily, the sensor may be a photoelectric sensor, a pressure sensor, a fingerprint sensor or the like. The photoelectric sensor may be an X-ray sensor or the like.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A thin film transistor, comprising a highly-textured dielectric layer, an active layer, a gate electrode and a source/drain electrode that are disposed on a base substrate; wherein
the active layer is disposed on a side, away from the base substrate; of the highly-textured dielectric layer;
the gate electrode and the active layer are insulated from each other, and the source/drain electrode comprises a source electrode and a drain electrode that are electrically connected to the active layer;
the active layer is a semiconductor film layer comprising a material of a silicon structure and grains are higher in orientation consistency in the active layer, and a dehydrogenated amorphous silicon layer is crystallized to convert the dehydrogenated amorphous silicon layer into the active layer; and
orientation indexes in crystals are higher in consistency in the highly-textured dielectric layer and constituent particles of the highly-textured dielectric layer have the same orientation index as monocrystalline silicon, and the highly-textured dielectric layer functions as a buffer layer and an induction template layer; and
the highly-textured dielectric layer induces constituent particles of the dehydrogenated amorphous silicon layer to be crystallized in the same direction as orientation indexes of the constituent particles of the highly-textured dielectric layer during crystallization of the amorphous silicon layer to form crystals of a single orientation.

2. The thin film transistor according to claim 1, wherein the highly-textured dielectric layer is made from any one of magnesium oxide, cerium oxide and zirconium oxide doped with yttrium.

3. The thin film transistor according to claim 1, wherein the gate electrode is disposed on a side, away from the base substrate, of the active layer, and the source/drain electrode is disposed on a side, away from the base substrate, of the gate electrode.

4. The thin film transistor according to claim 3, further comprising a first gate insulating layer and a second gate insulating layer; wherein
the first gate insulating layer is disposed between the active layer and the gate electrode, and the second gate insulating layer is disposed between the gate electrode and the source/drain electrode.

5. The thin film transistor according to claim 1, wherein the gate electrode is disposed on a side, close to the base substrate, of the highly-textured dielectric layer, and the source/drain electrode is disposed on a side, away from the base substrate, of the active layer.

6. The thin film transistor according to claim 5, further comprising a first gate insulating layer disposed between the highly-textured dielectric layer and the gate electrode.

7. A method of manufacturing a thin film transistor, comprising:
providing a base substrate;
forming a highly-textured dielectric layer on the base substrate;
forming an amorphous silicon layer on the base substrate on which the highly-textured dielectric layer is formed;
crystallizing a dehydrogenated amorphous silicon layer to convert the dehydrogenated amorphous silicon layer into a semiconductor film layer comprising a material of a silicon structure, to form an active layer;
forming a gate electrode and a source/drain electrode on the base substrate, wherein the source/drain electrode comprises a source electrode and a drain electrode, the gate electrode and the active layer are insulated from each other, and the source electrode and the drain electrode are electrically connected to the active layer; and
wherein grains are higher in orientation consistency in the active layer, orientation indexes in crystals are higher in consistency in the highly-textured dielectric layer, and constituent particles of the highly-textured dielectric layer have the same orientation index as monocrystalline silicon; and the highly-textured dielectric layer functions as a buffer layer and an induction template layer; and
the highly-textured dielectric layer induces constituent particles of the dehydrogenated amorphous silicon layer to be crystallized in the same direction as orientation indexes of the constituent particles of the highly-textured dielectric layer during crystallization of the amorphous silicon layer to form crystals of a single orientation.

8. The method according to claim 7, wherein forming the amorphous silicon layer on the base substrate on which the highly-textured dielectric layer is formed comprises:
depositing an amorphous silicon material on a side, away from the base substrate, of the highly-textured dielectric layer to form the amorphous silicon layer.

9. The method according to claim 7, wherein crystallizing the amorphous silicon layer comprises:
crystallizing the amorphous silicon layer by an excimer laser annealing process.

10. The method according to claim 7, wherein forming the highly-textured dielectric layer on the base substrate comprises:
forming the highly-textured dielectric layer on the base substrate by an electron beam evaporation process or an ion beam deposition process.

11. The method according to claim 7, wherein forming the gate electrode and the source/drain electrode on the base substrate comprises:
sequentially forming the gate electrode and the source/drain electrode on the base substrate on which the active layer is formed.

12. The method according to claim 11, after forming the active layer and prior to forming the gate electrode on the base substrate on which the active layer is formed, the method further comprises:
forming a first gate insulating layer on the base substrate on which the active layer is formed; and
after forming the gate electrode and prior to forming the source/drain electrode, the method further comprises:
forming a second gate insulating layer on the base substrate on which the gate electrode is formed.

13. The method according to claim 7, forming the gate electrode and the source/drain electrode on the base substrate on which the active layer is formed comprises:
prior to forming the highly-textured dielectric layer, forming the gate electrode on the base substrate; and
after forming the active layer, forming the source/drain electrode on the base substrate on which the active layer is formed.

14. The method according to claim 7, wherein the highly-textured dielectric layer is made from any one of magnesium oxide, cerium oxide and zirconium oxide doped with yttrium.

15. An array substrate, comprising a base substrate and a thin film transistor disposed on the base substrate, wherein the thin film transistor comprises a highly-textured dielectric layer, an active layer, a gate electrode and a source/drain electrode; wherein
- the active layer is disposed on a side; away from the base substrate, of the highly-textured dielectric layer;
- the gate electrode and the active layer are insulated from each other, and the source/drain electrode comprises a source electrode and a drain electrode that are electrically connected to the active layer;
- the active layer is a semiconductor film layer comprising a material of a silicon and grains are higher in orientation consistency in the active layer, and a dehydrogenated amorphous silicon layer is crystallized to convert the dehydrogenated amorphous silicon layer into the active layer; and
- orientation indexes in crystals are higher in consistency in the highly-textured dielectric layer, and constituent particles of the highly-textured dielectric layer have the same orientation index as monocrystalline silicon, and the highly-textured dielectric layer functions as a buffer layer and an induction template layer; and
- the highly-textured dielectric layer induces constituent particles of the dehydrogenated amorphous silicon layer to be crystallized in the same direction as orientation indexes of the constituent particles of the highly-textured dielectric layer during crystallization of the amorphous silicon layer to form crystals of a single orientation.

16. A display device, comprising the array substrate as defined in claim 15, wherein the display device is a liquid crystal display, an organic light-emitting diode display or a quantum-dot light-emitting diode display.

17. A sensor, comprising the array substrate as defined in claim 15, wherein the sensor is a photoelectric sensor, a pressure sensor or a fingerprint sensor.

* * * * *